US012604413B2

(12) United States Patent
Wyant et al.

(10) Patent No.: US 12,604,413 B2
(45) Date of Patent: Apr. 14, 2026

(54) METHOD FOR PRODUCING ELECTRICAL CIRCUITRY ON FILLED ORGANIC POLYMERS

(71) Applicants: DUPONT SAFETY & CONSTRUCTION, INC., Wilmington, DE (US); DUPONT ELECTRONICS, INC., Wilmington, DE (US)

(72) Inventors: Timothy Scott Wyant, Cheektowaga, NY (US); Gregory Scott Blackman, Media, PA (US); James Daniel Tremel, Hockessin, DE (US); Keith William Pollak, Youngstown, NY (US); Fazel Zare Bidoky, Newtown Square, PA (US)

( * ) Notice: Subject to any disclaimer, the term of this patent is extended or adjusted under 35 U.S.C. 154(b) by 15 days.

(21) Appl. No.: 18/086,404

(22) Filed: Dec. 21, 2022

(65) Prior Publication Data

US 2023/0225058 A1 Jul. 13, 2023

Related U.S. Application Data

(60) Provisional application No. 63/297,898, filed on Jan. 10, 2022.

(51) Int. Cl.
H05K 3/00 (2006.01)
H01Q 1/38 (2006.01)
(Continued)

(52) U.S. Cl.
CPC ......... H05K 3/0014 (2013.01); H05K 1/0373 (2013.01); H05K 3/207 (2013.01);
(Continued)

(58) Field of Classification Search
CPC . H01L 21/4846; H01L 23/145; H05K 3/0014; H05K 2201/10098; H05K 1/165;
(Continued)

(56) References Cited

U.S. PATENT DOCUMENTS 3,234,194 A 2/1966 Slocum
3,362,942 A 1/1968 Munu
(Continued)

FOREIGN PATENT DOCUMENTS

DE 102013213629 A1 1/2015
EP 2028688 A1 * 2/2009 ............. B32B 37/24

OTHER PUBLICATIONS

PCT International Search Report for Application No. PCT/US2022/081439; Petio Batev, Authorized Officer; ISA/EPO; Apr. 3, 2023.

*Primary Examiner* — Timothy J Thompson
*Assistant Examiner* — Rhadames Alonzo Miller

(57) ABSTRACT

Electrical circuitry is produced on the surface of an organic polymer. The electrical circuitry is produced on a support, and a polymerizable composition is brought into contact with the support and the circuitry. The polymerizable composition is polymerized while in contact with support and the circuitry to produce a solid, organic polymer. The electrical circuitry becomes adhered to and partially embedded in a surface of the solid organic polymer. The support may be removed subsequent to the polymerization step to expose the circuitry at the surface of the solid organic polymer.

12 Claims, 2 Drawing Sheets

(51) Int. Cl.

| | |
|---|---|
| *H05K 1/03* | (2006.01) |
| *H05K 3/20* | (2006.01) |
| *H10W 70/05* | (2026.01) |
| *H10W 70/695* | (2026.01) |
| *H10W 90/00* | (2026.01) |

(52) U.S. Cl.
CPC ......... *H10W 70/05* (2026.01); *H10W 70/695* (2026.01); *H10W 90/00* (2026.01); *H01Q 1/38* (2013.01); *H05K 2201/0209* (2013.01); *H05K 2201/0212* (2013.01)

(58) Field of Classification Search
CPC ... H05K 2201/0212; H05K 2201/0376; H05K 2201/09118; H05K 3/207; H01Q 1/38
See application file for complete search history.

(56) References Cited

U.S. PATENT DOCUMENTS

| | | | | |
|---|---|---|---|---|
| 3,450,088 | A | 6/1969 | Guier | |
| 4,944,908 | A * | 7/1990 | Leveque | B29C 45/14639 |
| | | | | 216/36 |
| 7,543,956 | B2 | 6/2009 | Piepgras et al. | |
| 9,338,295 | B2 | 5/2016 | Blanchard et al. | |
| 2002/0161094 | A1 * | 10/2002 | Miller, III | C08K 3/34 |
| | | | | 524/437 |
| 2007/0137141 | A1 * | 6/2007 | Petersen | H05K 3/0058 |
| | | | | 52/750 |
| 2012/0301825 | A1 * | 11/2012 | Yoshida | G03F 7/095 |
| | | | | 430/270.1 |
| 2013/0149514 | A1 * | 6/2013 | Hayashi | H01L 23/145 |
| | | | | 428/323 |
| 2014/0116764 | A1 * | 5/2014 | Inoue | H05K 1/036 |
| | | | | 428/339 |
| 2014/0118976 | A1 * | 5/2014 | Yoshikawa | H01L 23/5384 |
| | | | | 361/761 |
| 2018/0162026 | A1 | 6/2018 | Stvartak et al. | |
| 2020/0154568 | A1 * | 5/2020 | Na | H05K 3/0011 |
| 2021/0249168 | A1 | 8/2021 | Blackman et al. | |
| 2021/0249169 | A1 | 8/2021 | Blackman et al. | |
| 2021/0249902 | A1 | 8/2021 | Blackman et al. | |
| 2022/0375842 | A1 * | 11/2022 | Sakaguchi | H01L 23/49816 |

* cited by examiner

FIGURE 1
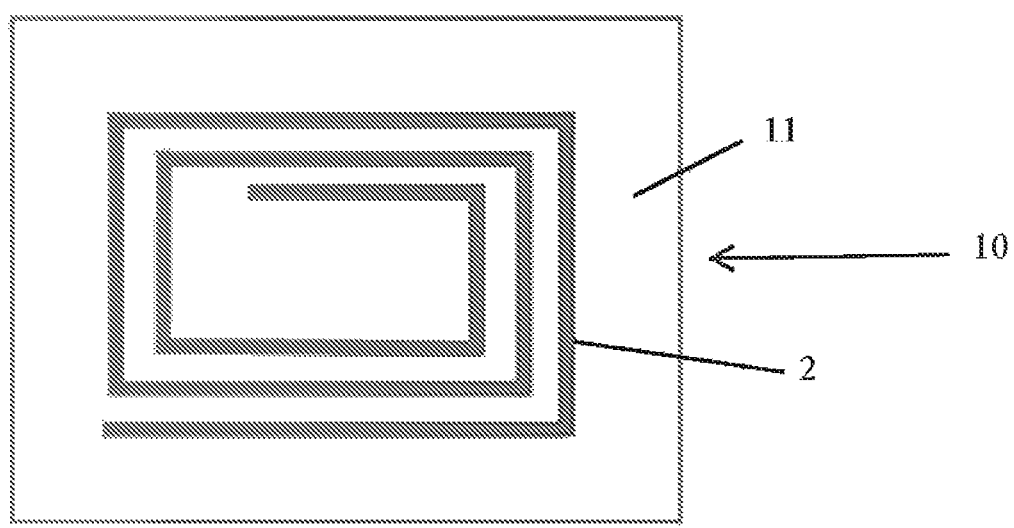
FIGURE 3
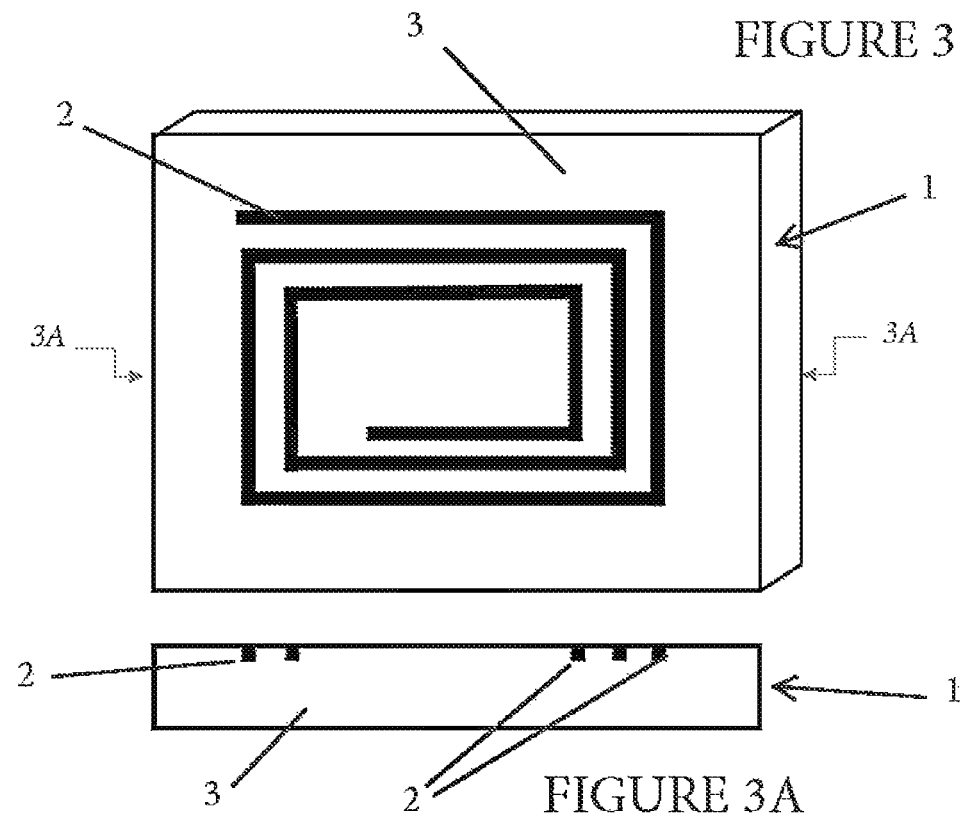
FIGURE 3A

1

METHOD FOR PRODUCING ELECTRICAL CIRCUITRY ON FILLED ORGANIC POLYMERS

BACKGROUND OF THE INVENTION

Field of the Invention

The present invention relates to methods for producing electrical circuitry on the surface of organic polymers.

Description of Related Art

Hard surface materials are present in residential, commercial and institutional settings. One such filled organic polymer product is manufactured and sold by DuPont under the Corian® brand name. Walls, ceilings, floors, countertops, tabletops and other surfaces are frequently made from or using such materials. Electrical components are frequently affixed to or adjacent to these surfaces, almost always via some kind of mechanical mounting. Electrical circuitry must be installed to provide power to those electrical components. This is also done mechanically, by running power lines behind or through the surface material to where it is needed. The mechanical installation of electrical components and circuitry is time-consuming and expensive. Surface materials often must be post-fabricated to produce channels or other openings to accommodate the electrical parts. This is often performed on-site as part of the installation process. This method is expensive and time-consuming.

U.S. Pat. No. 7,543,956 and US Published Patent Application No. 2018-0162026 describe approaches for incorporating light emitting diodes into polymeric materials. U.S. Pat. No. 7,543,956 describes a method in which light emitting diodes and associated circuitry are embedded into a polymeric hard surface material. The diodes and associated circuitry are mounted onto a sacrificial scaffold. A polymerizable material is poured around the circuitry, thereby encapsulating it and embedding it. The polymerizable material is then polymerized. Mechanical methods such as sanding, grinding, drilling, screwing, and inserting pins are needed to access the encapsulated electrical conductors.

US Published Patent Application No. 2018-0162026 describes a method in which electrical circuitry is applied to a transparent or translucent thermoplastic polymer that serves as a light guide. A decorative film is applied to a transfer sheet, and electrical circuitry is printed onto the decorative sheet. Other functional elements such as LEDs are then assembled onto the electrical circuitry. A heat-softened thermoplastic polymer is then molded around the resulting assembly to encapsulate the circuitry and functional elements. After solidifying the molten thermoplastic polymer, the transfer sheet is removed to expose the decorative surface.

BRIEF SUMMARY OF THE INVENTION

This invention is in one aspect a method for producing an electrical circuit on a polymeric material, comprising the steps of:

a) producing an electrical circuit on a surface of a support;

b) bringing a polymerizable composition containing at least one organic polymer precursor into contact with the support and the electrical circuit; and then c) polymerizing the at least one organic polymer precursor while the polymerizable composition is in contact with support and the electrical circuit to produce a solid polymer layer that includes an organic polymer produced in the polymerization of the at least one organic polymer precursor, the solid polymer layer having the electrical circuit adhered onto and at least partially embedded into a surface thereof.

In certain embodiments, the method further comprises d) after step c), removing the support from the electrical circuit and the solid polymer layer to expose the electrical circuit.

In a particular aspect, the invention is a method for producing an electrical circuit on a filled polymeric material, comprising the steps of:

a) producing an electrical circuit on a surface of a support;

b) bringing a polymerizable composition comprising (i) one or more polymerizable materials including at least one acrylate monomer and (ii) at least one particulate filler into contact with the support and the electrical circuit; and then c) polymerizing the polymerizable materials of the polymerizable composition while the polymerizable composition is in contact with the support and the electrical circuit to produce a filled, solid polymer layer that includes an acrylate polymer produced in the polymerization of the at least one acrylate monomer, the filled solid polymer layer having the electrical circuit adhered onto and at least partially embedded into a surface thereof.

The method of this particular aspect in some embodiments further comprises d), after step c), removing the support from the electrical circuit and the filled solid, electrically insulating acrylate polymer layer to expose the electrical circuit.

The invention is also an electrified polymeric material comprising a) a solid polymeric material and b) an exposed electrical circuit adhered to and at least partially embedded into at least one surface of the solid electrically insulating polymeric material.

In a particular aspect, the invention is an electrified polymeric material comprising a) a solid filled acrylate polymer, the filled acrylate polymer containing 55 to 95 percent by weight of filler particles, wherein the filled acrylate polymer has a Vicat softening temperature (ISO 306, test condition B/50N) of at least 75° C., a volume resistivity of at least $1 \times 10^{10}$ Ohm/cm, and a Rockwell M scale hardness of at least 80, and b) an exposed electrical circuit adhered to and embedded into at least one surface of the solid electrically insulating polymeric material.

BRIEF DESCRIPTION OF THE DRAWINGS

FIG. 1 is a top view of a transfer sheet with applied printed circuitry for use in producing an electrified polymeric material in accordance with the method of the invention.

FIG. 3 is an isometric view of an electrified polymeric material made in accordance with the invention.

FIG. 3A is a side sectional view, taken along lines 3A-3A of FIG. 3 of an electrified polymeric material made in accordance with the invention.

DETAILED DESCRIPTION OF THE INVENTION

Figure 2:
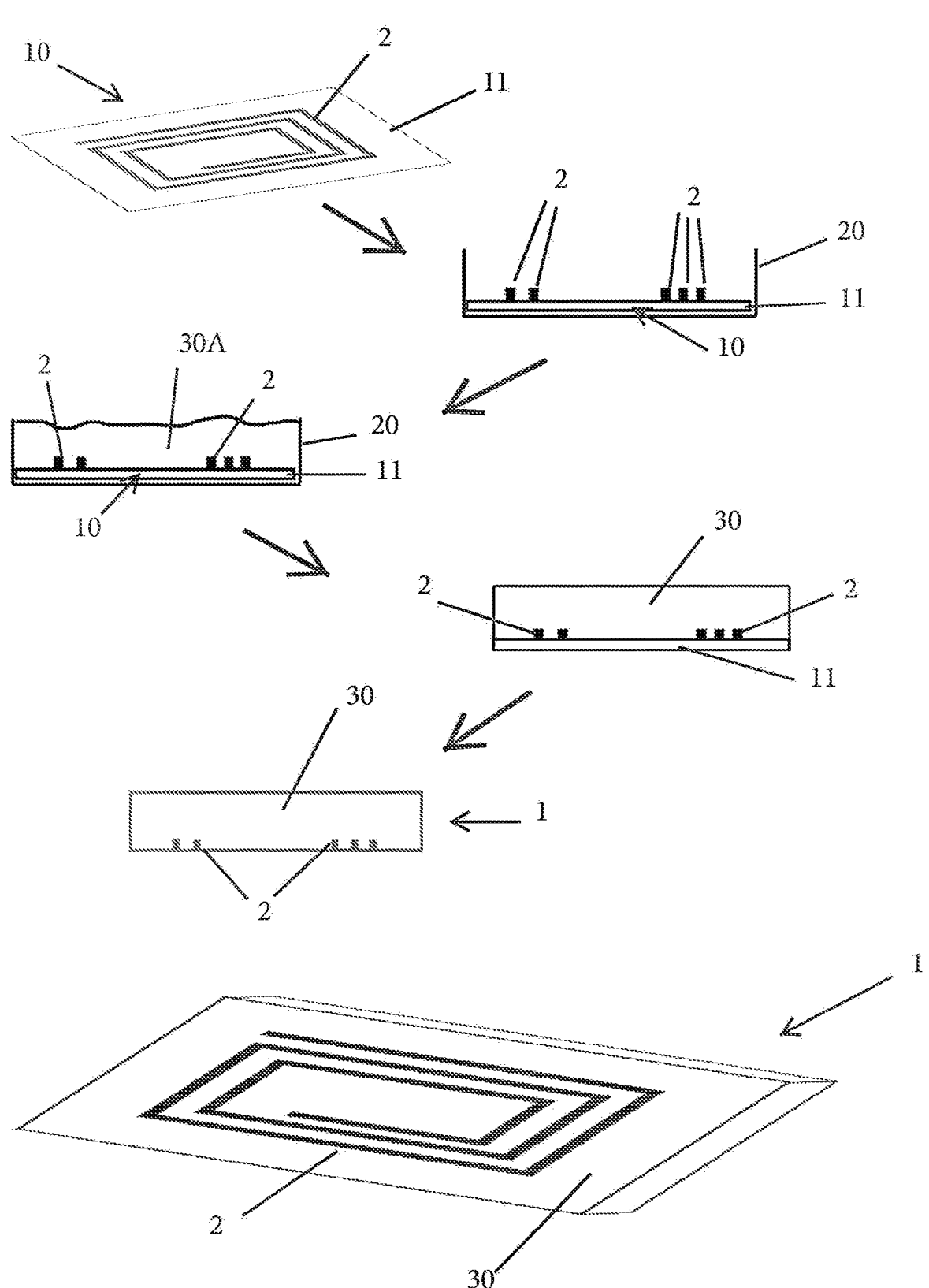
FIG. 2 is a schematic of a process for producing an electrified polymeric material in accordance with the invention.

The support is any material or combination of materials onto which an electrical circuit can be produced, and which is sufficiently stable (mechanically, thermally, chemically and otherwise) under the conditions of steps (b) and (c) of the method to allow the electrical circuit to remain intact and transfer to the surface of the polymer layer. The support in some embodiments is separable from the electrical circuit and the polymer layer after the polymerization step. In other embodiments, the support is not separable and remains with the product after the polymerization step. The support material may be rigid or flexible. It may consist of or comprise one or more functional elements (in addition to the electrical circuit) that remain with the product after the polymerization step, such as, for example, a decorative or protective film.

A rigid support may be made from, for example, various metals, wood and wood products such as plywood, particle board and strand board, stone, artificial stone product (such as filled organic polymer as described herein), organic polymer structural panels that optionally may be reinforced and optionally may be cellular; organic polymer boardstock, including boardstock made from melt-processible organic polymers such as foamed polystyrene, cardboard, gypsum, plaster, wallboard, concrete, and cement, among many others. Such a rigid support may be all or part of a mold or form in or on which the polymerizable composition is brought into contact with the support and electrical circuit and/or in or on which the polymerizable composition is polymerized to form the solid organic polymer. In such an embodiment, the support may be, for example, a bottom, side or top surface of such a mold or form, which surface comes into contact with the polymerizable composition during step b) of the method of the invention.

A flexible support may be made from, for example, a metal or organic polymer sheet, or a paper product such as wallpaper, newsprint, kraft paper or cardboard. Such a sheet may have a thickness of, for example, 12.7 μm to 2540 μm (0.5 to 100 mil) with a preferred thickness being up to 635 μm (25 mil) or up to 254 μm (10 mil).

A preferred support material is a transfer sheet, i.e., a flexible sheet that is separable from the electrical circuit and the polymer layer after the polymerization step. Organic polymers that are chemically, thermally and mechanically stable under the conditions of the polymerization step c) are useful materials of construction for the transfer sheet. Examples of such organic polymers include, without limitation, polyimide, polyester (including polyethylene terephthalate), polycarbonate, acrylic, styrenic polymers (including copolymers), phenolic resins and various polyolefins. The transfer sheet may be a single- or multilayer structure; it (or any constituent layer thereof) may be, for example, a film or sheet that is cast, melt-blown, extruded or plexifilamentary (such as Tyvek® plexifilamentary sheet from DuPont; it (or any constituent layer thereof) may be oriented uniaxially or biaxially, or unoriented.

The transfer sheet may be surface-treated in various ways as may be beneficial on the side that carries the electrical circuit. For example, the transfer sheet may be treated to increase the adhesion of the electrical circuit. This may be done chemically by including an adhesion promoter in the sheet or by corona discharge, plasma, UV or other treatment methods. Conversely, the transfer sheet may be surface-treated that facilitates release from the electrical circuit and/or the polymer layer formed in step c) of the process. For example, slip agents or other low surface energy materials may be applied to a surface of the transfer sheet that will carry the electrical circuit. Other surface treatments may include, for example, an antistatic treatment.

Specific examples of suitable transfer sheets include those sold under the trade names Melinex® and Mylar® (both available from DuPont Teijin Films). The transfer sheet may have a thickness of, for example, 12.7 μm to 2540 μm (0.5 to 100 mil) with a preferred thickness being up to 635 μm (25 mil) or up to 254 μm (10 mil).

The electrical circuitry typically includes one or more elements made from electrically conductive material or materials such as graphite; carbon black; various metals including silver, gold, aluminum, copper, platinum, iron, bronze and brass; as well as conductive polymers such as poly(3,4-ethylenedioxythiophene).

Turning to FIG. 1, electrical circuit transfer sheet 10 includes support 11, which as shown is a flexible polymeric film, having electrical circuit 2 printed or otherwise produced upon one surface thereof.

The electrical circuitry is produced on a surface of the support using any convenient method. The electrical circuitry so produced may cover a portion or all of the transfer sheet. A convenient method is a printing method in which ink having desirable electrical properties (conductivity, resistance, dielectric, phosphor, etc.) is applied to the support surface. "Ink" is used in the context of this invention to include both inks and pastes.

Suitable printing methods and inks are well known in the art. Inkjet, stencil, screen, 3D and transfer printing methods, for example, are useful. Conductive inks contain one or more conductive materials as described above; these typically are a suspension of particles of the conductive material in a liquid carrier. Useful inks are available commercially. Examples of suitable inks include BQ221, BQ242, 7102, 7105, 8144 and CB028 carbon conductive materials, 4816N, 4922N, 4929N, 5000, 5021, 5025, 5028, 5029, 5064, 5065, 5069, 5504N, 5815, 7713, 7723, 9145 and 9169 silver conductive materials, 5870, 5874, and 5876 silver/silver chloride conductive materials, 5524 silver/carbon conductive material, BQ321 platinum and BQ331 gold conductive material, 7164 translucent conductor material, 3571, 5018, 5018A, 5018G, 5036 and 8153 dielectric materials, and LuxPrint® 8150B, 8150L, 8152B, 8152K and 8154L electroluminescent materials, all sold by DuPont Microcircuit Materials (Research Triangle Park, North Carolina, USA). Such inks are applied to the support in a preselected pattern and if necessary dried and/or cured to produce the circuitry.

Other suitable methods of producing the electrical circuitry include photolithography and so-called "pick-and-place" methods.

The electrical circuitry on the support may have a thickness of, for example, at least 1, at least 5, at least 10, at least 15, or at least 20 ☐m, and, for example, up to 200, up to 150, up to 100 or up to 50 μm, with the preferred thickness depending on the electrical properties required of the various elements of the circuitry. The thickness may be uniform or non-uniform.

In a particular embodiment, the electrical circuitry produced on the support includes a plated copper structure manufactured by printing a layer of a conductive ink onto the support to form a conductive ink pattern and then plating copper onto all or a portion of the conductive ink pattern, such as is described, for example, in US Published Patent Applications 2021-0249168, 2021-0249169 and 2021-0249902. This produces a multilayer circuit having a layer of the conductive ink and a layer of copper. As described therein, an intervening layer of electroless metal may be present.

The electrical circuitry in some embodiments functions simply as a conductor that conducts power from a power source to one or more functional electrical components that are present within the electrical circuitry on the support or are external thereto. The electrical circuitry may comprise one or more functional electrical components, which may be passive or active and are limited only by the requirement that the circuitry can be produced onto the support and subsequently transferred to the solid polymeric material as described herein. The electrical circuitry may comprise one or more current conductors, dielectric elements, resistive elements, capacitors, inductors, transformers, transistors (such as bipolar junction transistors, MOSFETs, FETs and JEFTs), phosphor elements, and/or diodes (such as Zener diodes, photodiodes, Schottky diodes and/or light-emitting diodes). The electrical circuitry may comprise one or more integrated circuits, Application Specific Integrated Circuits (ASIC's), microcontrollers and thin chip or flexible hybrid versions thereof. For example, as shown in FIGS. 1 and 3, all or a portion of the electrical circuitry may be a spiral structure such as an Archimedean or rectangular, the opposing ends of which may be coupled with an external capacitor to form a tank circuit, as described in US Published Patent Application Nos. 2021-0249168 and 2021-0249902. Such a spiral structure or other circuit may function as an antenna. The circuitry may be or include capacitive sensing circuitry, display circuitry, audio circuitry, accelerometers, magnetometers and/or wireless (inductive) circuitry (such as charging circuitry, including Q1 charging circuitry). The circuit may be a 3D printed circuit. An important advantage of this invention is that it permits electronic circuitry to become embedded in the solid, electrically insulating polymeric material, providing a level of protection for the fragile electrical components.

A polymerizable composition containing at least one organic polymer precursor is applied to the surface of the transfer sheet and in contact with the electrical circuit. By "polymer precursor" it is meant one or more materials that react with other molecules of the same material and/or with another polymer precursor present in the polymerizable composition to produce an organic polymer.

One useful class of polymer precursors includes ethylenically unsaturated monomers, particularly those that are polymerizable at a temperature of 180° C. or lower. Examples of ethylenically unsaturated monomers include alpha-olefins (such as ethylene, propylene, 1-butene, 1-hexene, 1-octene and the like); vinyl aromatic monomers such as styrene, divinyl benzene and vinyl naphthylene; vinyl acetate; vinyl chloride; vinylidene chloride; and, preferably, acrylate monomers. The term "acrylate monomers" is used herein to refer to monomers having one or more acrylate or methacrylate groups, such as acrylic acid, methacrylic acid, acrylic esters such as methyl acrylate, ethyl acrylate, t-butyl acrylate, n-butyl acrylate, hydroxyethyl acrylate, methyl methacrylate, ethyl methacrylate, t-butyl methacrylate, n-butyl methacrylate, hydroxyethyl methacrylate, ethylene glycol diacrylate, ethylene glycol dimethacrylate, pentaerythritol tetraacrylate, pentaerythritol tetramethacrylate, dipentaerythritol penta/hexa methacylate, trimethylolpropane triacrylate, trimethyolpropane trimethacrylate, glycerin triacrylate, glycerin trimethacrylate, and the like.

Other useful polymer precursors include precursors to polyisocyanate-based polymers, including one or more polyisocyanates and optionally one or more curing agents such as water, one or more polyols, one or more alkanolamines, one or more primary- and/or secondary amine-containing compounds, and the like.

Still other useful polymer precursors include vinyl ester resins, unsaturated polyester resins, phenolic resins, epoxy resins and curing agents thereof.

The polymerizable composition may contain various other ingredients as may be necessary or desirable. Examples of such ingredients include, for example, polymerization catalysts, free radical initiators, chain transfer agents, crosslinkers, interfacial coupling agents, colorants, antioxidants, biocides, UV absorbers, pigments, preservatives, and the like. Free radical initiators include various peroxide or azo compounds or combinations thereof. Free radicals may be generated by application of heat, UV, activators/accelerators, or combinations thereof.

Particulate fillers preferably are present in the polymerizable composition. As used herein, a "filler" means any material that is solid at room temperature and atmospheric pressure, which is insoluble in the various ingredients of the polymerizable composition under the conditions encountered in the process of the invention (including the polymerization step). Mineral and/or ceramic fillers are preferred. Among these are alumina trihydrate, porcelain, glass, quartz, quartzite, rock gypsum, sand, silica, travertine, wollastonite, calcium carbonate, talc, feldspar, chert, chalcedony, alabaster, agate, various titanates, barium sulfate, lithopone, china clays, magnesite, mica, iron oxides, silicone dioxide, and various siennas. Such filler particles may have a d50 particles size from 0.1 micron to 100 microns, more preferably 7 to 100, and most preferably 10 to 50 microns, as determined by sieving methods.

The filler particles may be or include modified filler particles as described, for example, in U.S. Pat. No. 9,338,295.

Other useful fillers include macroscopic decorative particles known to the industry as crunchies". Crunchies are various filled or unfilled, pigmented or dyed, chips of polymers such as ABS resins, cellulose esters, cellulose ethers, epoxy resins, polyethylene, ethylene copolymers, melamine resins, phenolic resins, polyacetals, polyacrylics, polydienes, polyesters, polyisobutylenes, polypropylenes, polystyrenes, urea/formaldehyde resins, polyureas, polyurethanes, polyvinyl chloride, polyvinylidene chloride, polyvinyl esters and the like. Additional examples of macroscopic decorative particles are chopped fibers, natural stone particles, plastic particles, glass particles, mirror particles, micas, and metal flakes.

Fillers in some embodiments constitute 20 to 95%, preferably 55 to 95% of the total weight of the polymerizable composition and of the solid polymeric layer formed therefrom. The portion of the filler that is decorative particles may constitute, for example 1 to 25% of the total weight of the polymerizable composition and the solid polymeric layer formed therefrom.

An especially preferred polymerizable composition includes methyl methacrylate, preferably having a poly (methyl methacrylate) polymer dissolved therein. A crosslinking monomer having two or more acrylate and/or methacrylate groups, such as ethylene glycol dimethacylate or trimethylolpropane trimethacylate, may be present. Such a polymerizable composition preferably contains 55 to 95% by weight of one or more fillers, based on the weight of the polymerizable composition, preferably one or more of alumina trihydrate, porcelain and quartz, any of which may be modified with a functional material, especially a pigment, as described in U.S. Pat. No. 9,338,295. A free radical initiator, particularly a peroxy compound, preferably is present in an effective amount. Examples of peroxide free radical initiators include, for example, peroxymaleate esters as described in U.S. Pat. No. 3,234,194; metal salts of maleic acid hemi-peresters, as described in U.S. Pat. No. 3,362,942; hemi-peresters of maleic acid as described in U.S. Pat. No.

3,450,088; lauroyl peroxide, benzoyl peroxide; t-butyl per-benoate and t-butyl peroxypivalate. Such a preferred polymerizable composition may contain an amine compound such as a trialkylamine, benzyl amine, p-anisidine, 2,4,6-trimethyl aniline, N-methyl p-toluidine, N,N-dimethyl p-toluidine, N,N-diethyl p-anisidine and N,N-dimethyl 2,5-dimethoxyaniline, as described in U.S. Pat. No. 3,234,194. In addition, such a preferred polymerizable composition may contain up to 1 weight percent water, up to 1 weight percent calcium hydroxide and an effective amount of an accelerator. Mercapto compounds such as ethylene glycol dimercaptomethacrylate are useful accelerators.

In an especially preferred process, a syrup is formed that contains poly(methyl methacrylate) dissolved in methyl methacrylate. The syrup is combined with fillers to form a slurry. A cure package is combined with the slurry, simultaneously or after the filler and syrup are combined and immediately before contacting the resulting polymerizable composition with the support and electrical circuit. The cure package includes a free radical initiator and preferably an accelerator such as ethylene glycol dimecaptomethacrylate or an amine compound as described above. The free radical initiator may be or include a metal salt of a maleic acid hemi-perester, which may be formed in situ by combining a maleic acid hem i-perester acid with an alkali metal base or alkaline earth metal base such as calcium oxide to neutral the acid group and form the salt. Thus, a particularly preferred cure package includes the maleic acid hemi-perester acid, an alkali metal and/or alkaline earth metal base such as calcium oxide, and an accelerator such as ethylene glycol dimercaptomethylate.

The polymerizable composition is brought into contact with the support and in contact with the electrical circuit. This step can be performed, for example, by pouring or spraying the polymerizable composition onto the support and electrical circuit, as shown in FIG. 2 or, alternatively, by placing the polymerizable composition into a container such as a mold or form and laying the electrical circuit together with its support on top of the polymerizable composition. During this step, the polymerizable composition preferably is brought into direct contact with the electrical circuit; in particular, it is preferred that no intervening insulating material (such as wire insulation) is interposed between the electrical circuit and the polymerizable composition.

The support is positioned with the circuitry facing the polymerizable composition, e.g., with the electrical circuit facing up in cases in which the polymerizable composition is applied on top of the support and electrical circuit and facing down if the support and circuitry are to be applied on top of the polymerizable composition. In the embodiment shown in FIG. 2. In this manner, the electrical circuitry is brought into direct contact with and covered by the polymerizable composition. The opposing side of the support generally remains open, being uncovered by the polymerizable composition. This permits the support to be removed after the polymerizable composition has been polymerized, if desired.

Turning to FIG. 2, the electrical circuit transfer sheet 10, which includes electrical circuit 2 present (such as by printing) on the top side (as shown) of support 11, is disposed at the bottom of mold or trough 20. In FIGS. 2 and 3, the thickness of electrical circuit 2 is greatly exaggerated for purposes of illustration. Polymerizable composition 30A is dispensed into mold or trough 20, coming into contact with the top surface of support 11 and electrical circuit 2.

Another useful way of bringing the polymerizable composition into contact with the support and electrical circuit is to introduce the polymerizable composition into a mold or trough or onto a form, belt or other or other supporting apparatus, thereby producing an exposed surface, and laying the support with the electrical circuit facing down onto the exposed surface of the polymerizable composition. This method is adaptable to continuous production by using a traveling mold, trough, form, belt or other supporting apparatus and continuously feeding the electrical circuit and its support onto an exposed surface of the polymerizable composition. The support and electrical surface preferably are applied to a top surface of the polymerizable composition. An advantage of this method is that a good quality "show" surface is produced on the opposite side from the electrical circuit.

Another particularly useful way of bringing the polymerizable composition into contact with the support and electrical circuit is to place the support with the electrical circuit facing up onto a travelling platform and continuously pouring or spraying the polymerizable composition onto the traveling support. Such a method also allows for continuous production.

The organic polymer precursor(s) is then polymerized while the polymerizable composition is in contact with the support and the electrical circuitry. The polymerization conditions are selected together with the particular polymer precursors. In addition, polymerization conditions, in particular temperature conditions, are such that the support and the electrical circuitry retain their physical dimensions and do not become distorted, melted or otherwise thermally degraded. Preferred polymerizable compositions as described above may polymerize spontaneously if formed at a temperature of 10 to 30° C. without further applied heat. The polymerization temperature (including any exothermic temperature rise that may occur during the polymerization process) preferably does not exceed 180° C. and more preferably does not exceed 150° C. Cooling may be applied to control an exothermic temperature rise. Pressure conditions may vary widely so long as the polymerizable composition remains in contact with the support and the electrical circuitry throughout the polymerization step.

Turning back to FIG. 2, after an optional leveling and gauging step, in which the thickness of the resulting organic polymer layer 30 is determined, polymerizable composition 30A is cured to form solid organic polymer layer 30.

Polymerization is continued until the polymerizable composition is converted to a solid polymer layer. The polymer layer includes an organic polymer produced in the polymerization of the at least one organic polymer precursor. The electrical circuitry is adhered onto a surface of and at least partially embedded into the solid organic polymer layer, as illustrated in FIGS. 2 and 3A. In embodiments in which the support is subsequent removed, the circuitry becomes exposed, i.e., uncovered and open to the atmosphere.

FIGS. 3 and 3A illustrate an electrified polymeric material 1 of the invention. Electrified polymeric material 1 includes solid organic polymer layer 3 having electrical circuit 2 adhered onto a surface of and at least partially embedded into the polymer layer.

The solid organic polymer layer preferably has a Vicat softening temperature (ISO 306, test condition B/50N) of at least 25° C. The Vicat softening temperature preferably is at least 50° C., at least 75° C. or at least 100° C. The organic polymer component of the organic polymer layer preferably has a glass transition temperature of at least 25° C. and preferably at least 50° C., at least 75° C. or at least 100° C. as measured by dynamic mechanical analysis (DMA). If crystalline or semi-crystalline, the organic polymer component of the organic polymer layer may have a crystalline melting temperature of at least 25° C. and preferably at least 50° C., at least 75° C. or at least 100° C. as measured by differential scanning calorimetry.

The solid organic polymer layer in some embodiments is electrically insulating, having a volume resistivity of at least $1\times10^{10}$ Ohm/cm, and preferably a volume resistivity of at least $1\times10^{12}$ Ohm/cm, or at least $1\times10^{14}$ Ohm/cm, measured according to ATSM D257. In other embodiments, the solid organic polymer layer is conductive and/or semi-conductive, having a volume resistivity of less than $1\times10^{10}$ Ohm/cm (such as $1\times10^8$ to $9.9\times10^9$ Ohm/cm. The polymerizable composition and the resulting solid organic polymer layer may contain a conductive filler such as metal, graphite, carbon black and the like if desired to increase its electrical conductivity.

The solid organic polymer may have a relative permittivity of at least 2, preferably at least 3 (vacuum=1), as measured according to ASTM D150-18. The polymerizable composition and the resulting solid organic polymer layer may contain particles of a dielectric material such as calcium oxide, silicone dioxide, alumina and fumed silica if desired to increase its relative permittivity. A filler modified with such dielectric particles, such as produced according to the process described in U.S. Pat. No. 9,338,295, may be present in the polymerizable composition and the resulting solid organic polymer.

The solid organic polymer layer in some embodiment has a Mohs scale hardness (ASTM C1895) of at least 3, preferably at least 3.5., and/or a Rockwell M hardness (ASTM D785) of at least 80, especially 85 to 95.

The organic polymer present in the solid organic polymer layer may be thermoplastic or a thermoset material. The organic polymer may be linear, branched or crosslinked.

The solid organic polymer layer may have a thickness of, for example, 1 mm to 50.8 mm or more. A preferred thickness for products useful as hard surface materials is at least 3 mm, preferably at least 6 mm, up to 50.8 mm, preferably up to 25.4 mm or up to 20 mm.

Following the polymerization step, the solid organic polymer layer and the electrical circuitry in some embodiments is separated from the support, as shown in FIG. 2. In the preferred case in which the support is a transfer sheet, this is typically done simply by peeling the transfer sheet from the product. In cases in which the support is all or part of a mold or form, the separation step is accomplished by removing the product from the mold or form.

Because the electrical circuitry is exposed after the support is removed, it may be desired to sandwich the circuitry by applying one or more layers of another material overtop of the circuitry. This can be done in various ways.

In some embodiments, a second layer of the polymerizable composition is formed onto the exposed electrical circuitry and polymerized as before, thereby producing a sandwich structure in which the electrical circuitry forms an intermediate layer. The second layer of the polymerizable composition, and the resulting solid organic polymer layer may be the same as or different from the layer onto which the electrical circuit was applied.

In addition, various other protective and/or functional layers may be affixed atop of the exposed electrical circuitry using mechanical, adhesive, thermal or other means. For example, a layer of a previously-formed solid organic polymer layer, which may be the same as or different from that carrying the exposed electrical circuitry, may be affixed atop the circuitry to form such a sandwich structure. The organic layers may be joined using methods that do not impair the integrity of the electrical circuitry, such as mechanical or adhesive methods. When the organic layers are or include polymers of methyl methacrylate (which may include a filler material as described above), a suitable way of joining the organic polymer layers is by use of an adhesive system that includes methyl methacrylate monomer and a free radical initiator. Such adhesive systems may be two-part adhesive systems having separately packaged monomer and initiators, which parts are combined to produce a curable adhesive. Such adhesive systems are commonly used to join separate sections of organic polymer sheets during product installations to form, for example, countertops, walls or other hard surfaces. This method is a convenient way to provide electrical circuitry between seams of such an installation.

Alternatively, an adhesive including one as just described may be applied on top of the exposed electrical circuitry and cured to produce a protective layer.

The product of the invention (the "electrified polymeric material") is a solid organic polymer having an electrical circuit adhered to at least one surface thereof such that a surface of the electrical circuit is exposed. The electrical circuit preferably is embedded into the organic polymer and has an exposed surface approximately level with (such as no greater than 20 μm, especially no greater than 5 μm or no more than 2 μm higher or lower than) the adjacent surface of the organic polymer. The solid organic polymer preferably is substantially non-porous, having a void volume of no greater than 5% and more preferably no greater than 1%, and a bulk density of greater than 1 g/cm$^3$ and more preferably greater than 2 g/cm$^3$.

The electrified polymeric material is useful in many applications and to produce a number of devices.

One application is pre-wired wall, floor, ceiling, tabletops, counter tops and other building surfaces. In such an application, the electrical circuit may function as power lines that deliver current low voltage direct current (such as 30 V or lower) and/or typical utility power alternating current (such as 110 V/60 Hz or 230 V/50 Hz power) from a power source through the building surface. Such pre-wired building surfaces may deliver the power to, for example, electrical devices connected (permanently or temporarily) to the pre-wired building surface, or to an adjacent pre-wired building surface. This provides a way to install wiring into buildings through simple installation of the building surfaces, without the need for separate wiring in places where the pre-wired building surfaces are installed.

Another application is functional building surfaces, i.e., building surfaces that have embedded electrical or electronic devices. Examples of such embedded electrical or electronic devices include charging devices; card readers such as credit and bankcard readers; lighting; displays; heating devices; capacitive sensing devices, accelerometers, magnetometers and/or wireless (inductive) circuitry (such as charging circuitry, transmitters and receivers, including Q1 charging circuitry), among many others as well as components of any of the foregoing.

Various connectors, ports and the like may be provided to the electrified polymeric material as needed or convenient to connect it to a power source, to other electrified polymeric materials of the invention, and/or to various functional devices. These may in some cases, be provided during the steps of manufacturing the electrified polymeric material or may be provided afterward.

EXAMPLES

The following examples are provided to illustrate the invention but are not intended to limit the scope thereof. All parts and percentages are by weight unless otherwise indicated.

Example 1

Electrical circuitry is printed onto a 125 □m heat-stabilized, corona-treated poly(ethylene terephthalate) transfer film (Melinex® ST505 from Tekra, LLC) using a silver conductive ink (DuPont Microcircuit Materials 5000) and a TF-226 pattern, 325 ss mesh, 1.1 wire, 30 angle screen. Print pressure is 35 psi (241 kPa); flood is 25.4 μm; line speed is 10.16 cm/second. Drying is performed at a temperature of 130° C. Print thickness is approximately 10 μm.

The printed transfer film is placed, printed circuitry facing up, into the bottom of a box mold. A polymerizable composition containing methyl methacrylate, a dissolved poly (methyl methacrylate), a peroxy free radical initiator, 55-80 weight percent based on total weight of alumina trihydrate particles, and ethylene glycol dimercaptoacetate is poured on top of the transfer film and into contact with the printed electrical circuit, to form a layer approximately 12.7 mm thick that covers the printed electrical circuit. The polymerizable composition is then cured in the box mold at a temperature of about 130° C. to produce a filled, solid polymer suitable for use as a hard surface material. The polymer is removed from the box together with the electrical circuit and the transfer sheet and cooled to about room temperature. The transfer sheet is then peeled off, leaving the entirety of the electrical circuit adhered at a surface of the organic polymer. Upon inspection, the electrical circuit is found to be imbedded into the organic polymer with its upper surface exposed. Electrical testing confirms the electrical circuit functions as designed.

Example 2

Example 1 is repeated, this time replacing the silver conductive ink with a carbon conductive ink (Dupont Microcircuit Materials 7102). Pressure is increased to 42 psi (290 kPa) and line speed is reduced to 7.6 cm/second. Print thickness is 12.6 μm. Upon removing the transfer sheet, the entire electrical circuit remains with the organic polymer, being partially embedded therein with an exposed surface. Electrical testing confirms the electrical circuit functions as designed.

Example 3

Example 1 is again repeated with a transfer film that has LED circuitry printed upon it. The LEDs are arranged in a rectangular pattern of 16 columns and 10 rows. Four columns of blue and green LEDs alternate. Upon removing the transfer sheet, the entire electrical circuit including the LEDs remains with the organic polymer, being partially embedded therein with an exposed surface. The LEDs all function correctly when an electrical current is applied to the circuit.

What is claimed is:

1. A method for continuous production of an electrical circuit on a filled polymeric material, comprising the steps of:
   a) continuously introducing onto a traveling support a support comprising an electrical circuit and a polymerizable composition, wherein the polymerizable composition on the traveling support has a first surface in contact with the traveling support, and a second exposed surface; and
   wherein the electrical circuit is in contact with either the first or second surface of the polymerizable composition, and
   wherein the polymerizable composition comprises
      (i) one or more polymerizable materials including methyl methacrylate and
      (ii) at least one particulate filler comprising alumina trihydrate; and then
   b) continuously polymerizing the polymerizable materials of the polymerizable composition while the polymerizable composition is in contact with the electrical circuit to continuously produce the electrical circuit on the filled polymeric material comprising a polymer of methyl methacrylate,
      wherein the electrical circuit is adhered onto and at least partially embedded into the filled polymeric material.

2. The method of claim 1, further comprising, after step b), a step of
   c) removing the support from the electrical circuit to expose the electrical circuit.

3. The method of claim 1 wherein the at least one particulate filler constitutes 55 to 95 percent by weight of the polymerizable composition.

4. The method of claim 1
   wherein the filled polymeric material has a Vicat softening temperature (ISO 306, test condition B/50N) of at least 75° C., a volume resistivity of at least $1\times10^{10}$ Ohm/cm, and a Rockwell M scale hardness of at least 80.

5. The method of claim 1 wherein the at least one particulate filler further includes polymeric decorative particles and the polymeric decorative particles constitute 1 to 25 percent of the total weight of the filled polymeric material.

6. The method of claim 1 wherein the support of the support comprising the electrical circuit is an organic polymer transfer sheet.

7. The method of claim 1 wherein the filled polymeric material has a volume resistivity of at least $1\times10^{12}$ Ohm/cm when measured according to ATSM D257.

8. The method of claim 1, further comprising producing the support comprising the electrical circuit prior to step a).

9. The method of claim 8 wherein the electrical circuit of the support comprising the electrical circuit is produced by printing.

10. The method of claim 1 wherein the traveling support is a traveling mold, trough, form, belt, or other supporting apparatus.

11. The method of claim 1 wherein the support comprising the electrical circuit is continuously fed onto the traveling support and the polymerizable composition is continuously poured or sprayed the onto the traveling support, with the electrical circuit in contact with the first surface of the polymerizable composition.

12. The method of claim 1 wherein the support comprising the electrical circuit is continuously fed onto the polymerizable composition on the traveling support, with the electrical circuit in contact with the second exposed surface of the polymerizable composition.

* * * * *